(12) United States Patent
Satake (10) Patent No.: US 8,409,359 B2
(45) Date of Patent: Apr. 2, 2013

(54) SUBSTRATE PROCESSING APPARATUS, SUBSTRATE PROCESSING METHOD AND STORAGE MEDIUM

(75) Inventor: Keigo Satake, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 587 days.

(21) Appl. No.: 12/333,412

(22) Filed: Dec. 12, 2008

(65) Prior Publication Data

US 2009/0159105 A1 Jun. 25, 2009

(30) Foreign Application Priority Data

Dec. 21, 2007 (JP) ................................ 2007-331062

(51) Int. Cl.
*B08B 7/04* (2006.01)
(52) U.S. Cl. ......... 134/18; 134/56 R; 134/57 R; 134/66; 134/103.1; 134/10; 438/14; 438/800
(58) Field of Classification Search ............... 134/57 R, 134/18, 66, 103.1, 10, 56 R; 438/14, 800
See application file for complete search history.

(56) References Cited

U.S. PATENT DOCUMENTS

| | | | |
|---|---|---|---|
| 5,035,200 A | 7/1991 | Moriyama et al. | |
| 6,245,156 B1 * | 6/2001 | Taniyama et al. | 134/6 |
| 6,357,457 B1 * | 3/2002 | Taniyama et al. | 134/57 R |
| 2003/0209259 A1 * | 11/2003 | Tung et al. | 134/18 |
| 2006/0162660 A1 | 7/2006 | Shimizu | |
| 2006/0219268 A1 * | 10/2006 | Jacobson | 134/26 |
| 2007/0131256 A1 * | 6/2007 | Nanba et al. | 134/33 |
| 2007/0134822 A1 * | 6/2007 | Yamamoto et al. | 438/14 |

FOREIGN PATENT DOCUMENTS

| | | |
|---|---|---|
| JP | 5-308066 A | 11/1993 |
| JP | 05308066 A * | 11/1993 |
| JP | H08-102459 A | 4/1996 |
| JP | 08-316188 A | 11/1996 |
| JP | H08-316188 A | 11/1996 |

(Continued)

OTHER PUBLICATIONS

German Office Action for German Patent Application File No. 10 2008 062 699.6-43 dated May 28, 2010 with English translation.

(Continued)

*Primary Examiner* — Michael Kornakov
*Assistant Examiner* — Katelyn Whatley
(74) *Attorney, Agent, or Firm* — Abelman, Frayne & Schwab (57) ABSTRACT

Disclosed is a substrate processing apparatus capable of decreasing the frequency of shutdown of the apparatus due to lack of processing liquid in a processing liquid supply unit, as well as efficiently using the processing liquid to improve a yield ratio. The substrate processing apparatus includes a plurality of liquid processing units to conduct liquid processing of substrates a substrate carrying unit to carry the substrates in and out of the liquid processing units, a processing liquid supply unit to supply the liquid processing units with processing liquid, and a level gauge to detect an amount of the processing liquid remaining in the processing liquid reservoir of the processing liquid supply unit. The carry of the substrates in the liquid processing units is suspended when the level gauge detects that the amount of the processing liquid remaining in the processing liquid reservoir is below a predetermined threshold.

9 Claims, 5 Drawing Sheets

FOREIGN PATENT DOCUMENTS

| | | |
|---|---|---|
| JP | 08-321482 A | 12/1996 |
| JP | 09-260330 A | 10/1997 |
| JP | H09-260330 A | 10/1997 |
| JP | H11-207274 A | 8/1999 |
| JP | 2000-058492 A | 2/2000 |
| JP | 2004-247509 A | 9/2004 |
| JP | 2005-161284 A | 6/2005 |
| JP | 2007-109738 A | 4/2007 |
| KR | 1020050052329 A | 6/2005 |
| TW | 561075 B | 11/2003 |
| TW | 1249218 B | 2/2006 |
| TW | 200723381 A | 6/2007 |

OTHER PUBLICATIONS

Office Action dated Aug. 3, 2011, issued from the Japan Patent Office (JPO) for Japanese Patent Application No. 2007-331062, and a partial English translation thereof.

Office Action dated Apr. 14, 2011, issued from the German Patent and Trademark Office (GPTO) for German Patent Application No. 10 2008 062 699.6-43 , and an English translation thereof.

An Office Action dated Apr. 10, 2012, issued from the Taiwan Patent Office (TIPO) of Taiwanese Patent Application No. 097149801 and a partial English translation thereof.

* cited by examiner

SUBSTRATE PROCESSING APPARATUS, SUBSTRATE PROCESSING METHOD AND STORAGE MEDIUM

BACKGROUND OF THE INVENTION

1. Field of the Invention

The present invention relates to a substrate processing apparatus for conducting liquid processing of various types of substrates, such as semiconductor wafers, or glass substrates of liquid crystal panels, etc. More particularly, the present invention relates to a substrate processing apparatus for distributing and supplying processing liquid from a common processing liquid supply unit to a plurality of processing units.

2. Description of the Prior Art

Manufacturing processes of semiconductors or liquid crystal panels include liquid processing, for example, cleaning or etching. Liquid processing includes emitting processing liquid to a target object or dipping a target object in processing liquid Substrate processing apparatuses can be used to automatically conduct liquid processing. Substrate processing apparatuses have a plurality of liquid processing units to conduct liquid processing of substrates, a processing liquid supply unit to supply a processing liquid to the liquid processing units, included in a common case, a cassette connected to the common case, and a substrate carrying unit to carry in/out target substrates between the cassette and the liquid processing units.

Substrate processing apparatuses supply processing liquid from a common processing liquid supply unit to a plurality of liquid processing units. A processing liquid supply unit has a processing liquid combination tank to combine stock solutions supplied from a plurality of stock solution sources to produce processing liquid In some cases, a processing liquid reservoir may be used to contain the processing liquid supplied from the processing liquid combination tank and to distribute and supply the processing liquid to the liquid processing units. A return channel may be also used to return residual processing liquid, i.e. a part of the processing liquid that has not been used by the liquid processing units, to the processing liquid reservoir. An example of returning the residual processing liquid is disclosed in Japanese Laid-open Patent Publication No. 2007-109738, the disclosure of which is incorporated herein by reference in its entirety.

Further, substrate processing apparatuses also have a sensor installed in the processing liquid supply unit to detect the amount of the remaining processing liquid. Thus, if no processing liquid exists in the processing liquid supply unit, the apparatus is shut down.

However, if a substrate processing apparatus is enforced to shut down for lack of the processing liquid remaining in the processing liquid supply unit, the liquid processing of substrates is suspended until the processing liquid supply unit is replenished with the processing liquid. This degrades the throughput of the substrate processing apparatus.

Furthermore, if a substrate processing apparatus is enforced to shut down, all the substrates existing in the liquid processing units will be defective. As a result, a yield ratio is decreased.

In some cases, even if no processing liquid exists in the processing liquid supply unit the processing liquid remaining in the pipe between the processing liquid supply unit and the liquid processing units may be used to complete processing of substrates existing in the liquid processing units. Furthermore, the processing liquid returning from the liquid processing units to the processing liquid reservoir via the return channel may be used to feed an operating liquid processing unit.

SUMMARY OF THE INVENTION

Accordingly, in order to solve the above-mentioned problems, the present invention provides a substrate processing apparatus capable of decreasing the frequency of shutdown of the apparatus due to lack of the processing liquid in the processing liquid supply unit, while effectively using the processing liquid to improve a yield ratio.

In accordance with an aspect of the present invention, a substrate processing apparatus is provided. The apparatus includes a plurality of liquid processing units to conduct liquid processing of substrates, a substrate carrying unit to carry the substrates in and out of the liquid processing units, a processing liquid supply unit to supply the liquid processing units with processing liquid, a processing liquid amount detector to detect an amount of the processing liquid remaining in the processing liquid supply unit, and a controller to suspend carrying the substrates in the liquid processing units by the substrate carrying unit when the processing liquid amount detector detects that the amount of the processing liquid remaining in the processing liquid supply unit is below a predetermined threshold.

The processing liquid supply unit includes a processing liquid combination tank to combine stock solutions supplied from a plurality of stock solution sources to produce the processing liquid, a processing liquid reservoir to contain the processing liquid, a processing liquid transfer unit to transfer the processing liquid from the processing liquid combination tank to the processing liquid reservoir, and a processing liquid distributor to distribute the processing liquid from the processing liquid reservoir to the liquid processing units.

The processing liquid amount detector may detect the amount of the processing liquid remaining in the processing liquid reservoir.

The processing liquid amount detector may detect the amount of the processing liquid remaining in the processing liquid combination lank.

The substrate processing apparatus further includes a transfer malfunction detector to detect a malfunction of the processing liquid transfer unit. The controller may suspend carrying the substrates in the liquid processing units by the substrate carrying unit when the transfer malfunction detector detects the malfunction of the processing liquid transfer unit.

The substrate processing apparatus further includes a source malfunction detector to detect a malfunction of the stock solution sources. The controller may suspend carrying the substrates in the liquid processing units by the substrate carrying unit when the source malfunction detector detects the malfunction of the stock solution sources.

The substrate processing apparatus further includes a supply amount detector to detect a flow rate of the processing liquid supplied to each liquid processing unit. The controller may suspend supplying the processing liquid to the liquid processing units and record an event that liquid processing of the substrates in the liquid processing units is incomplete, when the supply amount detector detects that the amount of the processing liquid supplied to the liquid processing units is below a predetermined threshold.

The controller may further control the liquid processing units so as to clean the substrates with pure water and to dry the substrates, when the supply amount detector detects that the amount of the processing liquid supplied to the liquid processing units is below the predetermined threshold.

The substrate processing apparatus further includes a processing liquid return unit to return the processing liquid not used by the liquid processing units to the processing liquid supply unit in a lump and a returning amount detector to detect a flow rate of the processing liquid flowing in the processing liquid return unit The controller may record an event that liquid processing of the substrates in the liquid processing units, in which the liquid processing with the processing liquid has not been completed, is incomplete, when the returning amount detector detects that the flow rate of the processing liquid is below a predetermined threshold.

The controller may make the liquid processing units, in which the liquid processing with the processing liquid has not been completed, to clean the substrates with pure water and to dry the substrates when the returning amount detector detects that the flow rate of the processing liquid is below the predetermined threshold.

In accordance with an aspect of the present invention, a substrate processing method is provided. The method includes sequentially carrying substrates in a plurality of liquid processing units, supplying processing liquid from a processing liquid supply unit to the liquid processing units to conduct liquid processing of the substrates, and sequentially carrying the substrates out of the liquid processing units after the liquid processing is complete. Carrying the substrates in the liquid processing units is suspended when an amount of the processing liquid remaining in the processing liquid supply units is below a predetermined threshold.

The processing liquid supply units include a processing liquid combination tank a processing liquid reservoir, a processing liquid transfer unit and a processing liquid distributor. The substrate processing method further includes combining in the processing liquid combination tank stock solutions supplied from a plurality of stock solution sources to produce the processing liquid, transferring the processing liquid produced in the processing liquid combination tank to the processing liquid reservoir by the processing liquid transfer unit and containing the processing liquid in the processing liquid reservoir, and distributing the processing liquid contained in the processing liquid reservoir to the liquid processing units by the processing liquid distributor.

The substrate processing method further includes suspending carrying the substrates in the liquid processing units when the amount of the processing liquid in the processing liquid reservoir is below a predetermined threshold.

The substrate processing method further includes suspending carrying the substrates in the liquid processing units when the amount of the processing liquid in the processing liquid combination tank is below a predetermined threshold.

The substrate processing method further includes suspending carrying the substrates in the liquid processing units when a malfunction of the processing liquid delivery unit is detected.

The substrate processing method may further include suspending carrying the substrates in the liquid processing units when a malfunction of the stock solution sources is detected.

The substrate processing method may further include detecting a flow rate of the processing liquid supplied to each liquid processing unit and suspending operation of the liquid processing units and recording an event that liquid processing of the substrates in the liquid processing units is incomplete when it is detected that the supplying the processing liquid to the liquid processing units is suspended.

The substrate processing method may further include making the liquid processing units to clean the substrates with pure water and to dry the substrates when it is determined that the supplying the processing liquid to the liquid processing units is suspended.

The substrate processing method may further include returning the processing liquid that is not used by the liquid processing units to the processing liquid supply unit in a lump, and suspending liquid processing of the substrate and recording an event that the liquid processing of substrates in all operating liquid processing units is incomplete, when a flow rate of the processing liquid returning to the processing liquid supply unit is below a predetermined threshold.

The substrate processing method may further include making all operating liquid processing units to clean the substrates with pure water and to dry the substrates when the flow rate of the processing liquid returning to the processing liquid supply unit is below the predetermined threshold.

In accordance with further aspect of the present invention, a storage medium storing a computer-executable program to control a substrate processing apparatus is provided. The substrate processing apparatus includes a plurality of liquid processing units to conduct liquid processing of substrates, a substrate carrying unit to carry substrates in and out of the liquid processing units, a processing liquid supply unit to supply the liquid processing units with processing liquid and a processing liquid amount detector to detect an amount of the processing liquid remaining in the processing liquid supply units. The program includes suspending caring the substrates in the liquid processing units when the amount of the processing liquid remaining in the processing liquid supply unit is below a predetermined threshold.

In the substrate processing apparatus according to the present invention, if the processing liquid in the processing liquid reservoir or the processing liquid combination tank is insufficient or if the processing liquid delivery unit to deliver the processing liquid from the processing liquid combination tank to the processing liquid reservoir is malfunctioning, carrying new (material) substrates in the liquid processing units is suspended while continuing the current processing of substrate. This guarantees efficient use of the processing liquid and improves the protection and yield ratio of substrates.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE INVENTION

Hereinafter, an exemplary embodiment of the present invention will be described with reference to the accompanying drawings. In the following description and drawings, the same reference numerals are used to designate the same or similar components, and so repetition of the description on the same or similar components will be omitted.

Figure 1:
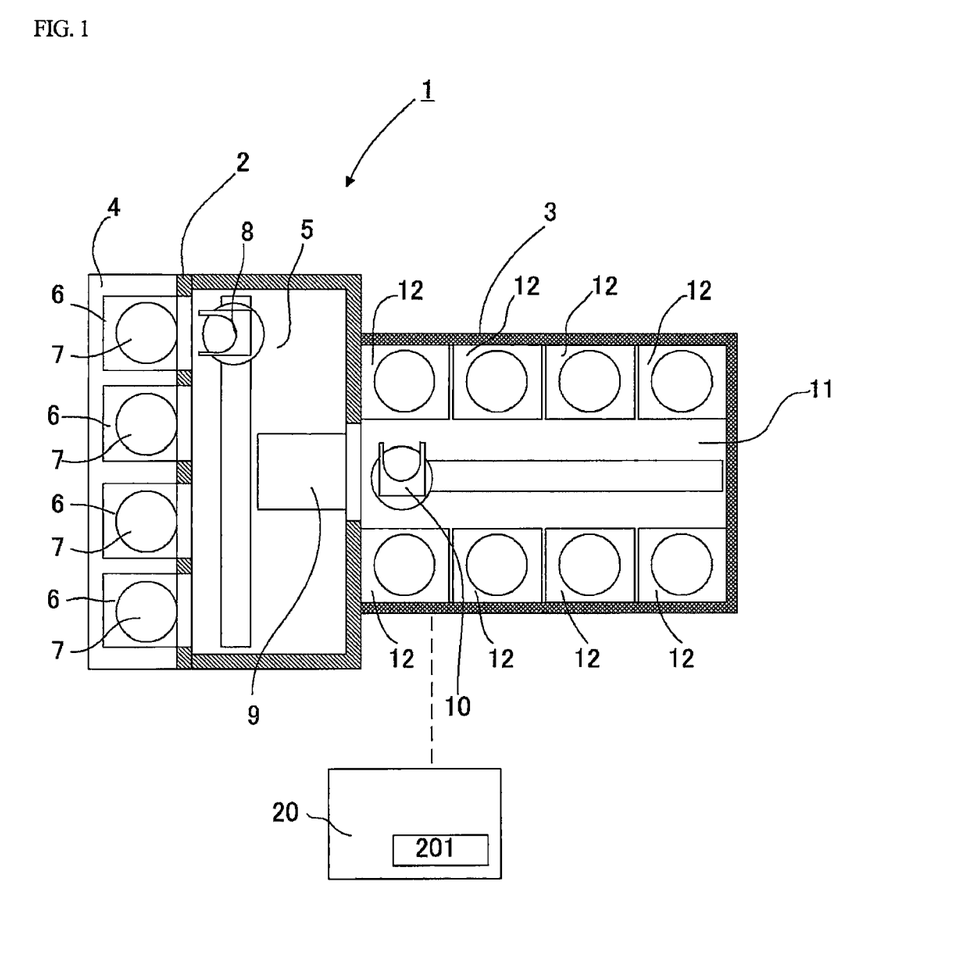
FIG. 1 is a conceptual top view showing a substrate processing apparatus according to the present invention.

FIG. 1 is a conceptual top view showing a substrate processing apparatus according to the present invention.

As shown in FIG. 1, the substrate processing apparatus 1 includes a substrate carrying-in/carrying-out unit 2 and a liquid processing unit 3.

The substrate carrying-in/carrying-out unit 2 includes a cassette loading unit 4 and a sub-transfer unit 5. The cassette loading unit 4 refers to an interface to load cassettes 6 and hermetically connecting them. For example, the cassettes 6 are hermetically connected to the cassette loading unit 4 so that substrates 7 in the cassettes 6 can be carried in the sub-transfer unit 5 without being exposed to an outer atmosphere. The sub-transfer unit 5 has a first transfer arm 8 and a feed table 9. The first transfer arm 8 refers to a robot arm to carry the substrates 7 in/out of the cassettes 6 connected to the cassette loading unit 4. The feed table 9 refers to a temporary loading table to transfer the substrates 7 between the sub-transfer unit 5 and the liquid processing unit 3. The cassettes 6 refer to convey containers to contain a plurality of substrates 7 horizontally.

The liquid processing unit 3 has a main transfer unit 11 having a second transfer arm 10, and eight substrate processing units 12 arranged on both sides of the main transfer unit 11. The second transfer arm 10 is adapted to transfer the substrates 7 between the feed table 9 and the substrate processing units 12. For example, the first transfer arm 8 carries a substrate 7, which is to be processed, out of the cassette 6 and places the substrate 7 on the feed table 9. Then, the second transfer arm 10 receives the substrate 7 and transfers it to the substrate processing unit 12. After the substrate 7 has been processed in the substrate processing unit 12, the second transfer arm 10 carries the processed substrate 7 out of the substrate processing unit 12, and transfers the substrate 7 to the feed table 9.

The substrate processing units 12 refer to etching devices to apply processing liquid to the substrates 7 to etch them, to clean the substrates 7 with distilled water, and to dry the substrates 7. The substrate processing apparatus 1 also has a computer 20 and a processing liquid supply unit 13, which is described later. The first transfer arm 8, the second transfer arm 10, the substrate processing unit 12, and the processing liquid supply unit 13 are controlled by the computer 20 and operated automatically.

Figure 2:
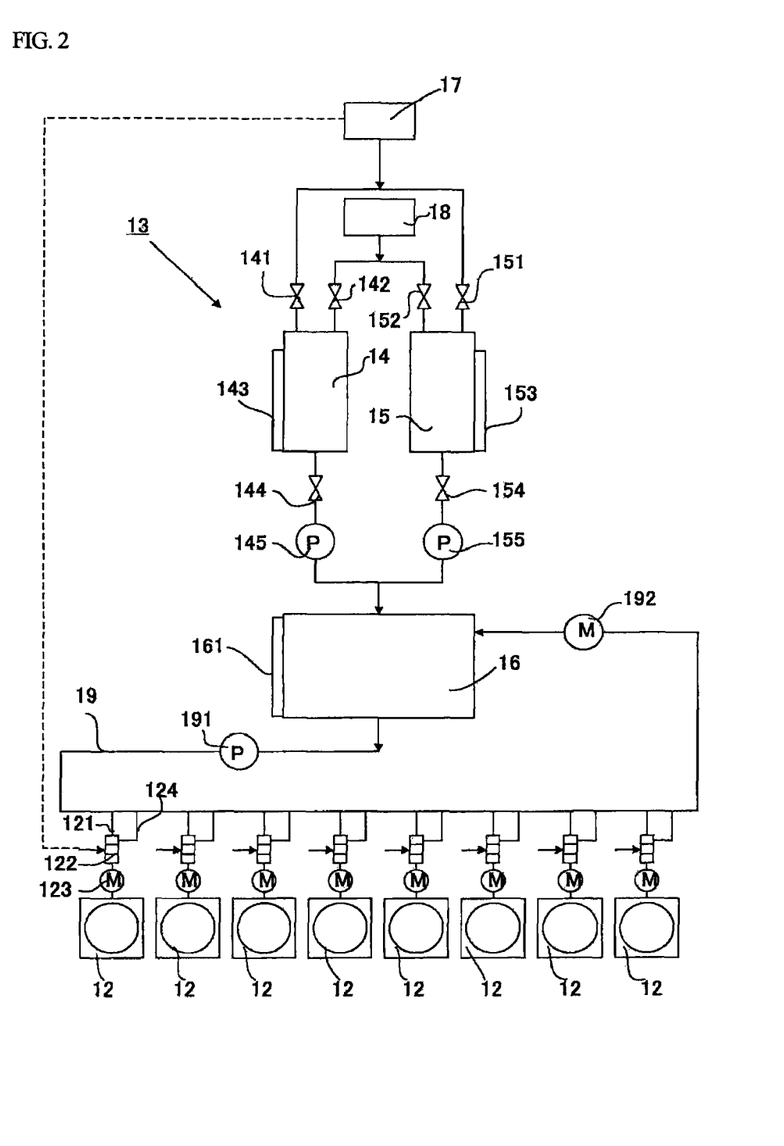
FIG. 2 is a distribution diagram of pipes illustrating the structure of a processing liquid supply unit.

FIG. 2 is a distribution diagram of pipes illustrating the structure of the processing liquid supply unit 13. For convenience of description, some elements that are not necessary to explain the present invention are omitted in FIG. 2. The structure and function of the processing liquid supply unit 13 will be described with reference to FIG. 2.

As shown in FIG. 2, the processing liquid supply unit 13 is adapted to supply the substrate processing unit 12 with predetermined processing liquid (corrosive liquid). The processing liquid supply unit 13 includes processing liquid combination tanks 14 and 15 and a processing liquid reservoir 16.

The processing liquid combination tanks 14 and 15 refer to containers to mix pure water supplied from a pure water source 17 (e.g. a pure water supply pipe arranged in a plant) with a chemical liquid (stock solution) supplied from a chemical liquid source 18 (e.g. a chemical liquid supply pipe arranged in a plant) to produce processing liquid having a predetermined concentration. The processing liquid supply unit 13 further includes flow rate adjustment valves 141 and 151 installed between the pure water source 17 and the processing liquid combination tanks 14 and 15, and flow rate adjustment valves 142 and 152 installed between the chemical liquid source 18 and the processing liquid combination tanks 14 and 15. Thus, the pure water and chemical liquid (stock solution) can flow into the processing combination tanks 14 and 15 at a predetermined ratio. The processing liquid combination tanks 14 and 15 include level gauges 143 and 153 to detect the amount of the processing liquid remaining in the processing liquid combination tanks 14 and 15. The processing liquid combination tanks 14 and 15 are connected to the processing liquid reservoir 16 by pipes so that the processing liquid produced by the processing liquid combination tanks 14 and 15 is transferred to the processing liquid reservoir 16. To this end, opening/closing valves 144 and 154 and pumps 145 and 155 are installed on the pipes between the processing liquid combination tanks 14 and 15 and the processing liquid reservoir 16.

Because two processing liquid combination tanks 14 and 15 are used, the producing and transferring of the processing liquid can be alternatively conducted. For example, the opening/closing valve 144 is closed, and the pump 145 is deactivated to produce a processing liquid in the liquid processing combination tank 14 and to adjust the concentration of the processing liquid. At the same time, the opening/closing valve 154 is opened, and the pump 155 is activated to transfer the processing liquid from the processing liquid combination tank 15 to the processing liquid reservoir 16. When the processing liquid in the processing liquid combination tank 15 is almost exhausted due to the complete transferring of the processing liquid, no more processing liquid is produced in the processing liquid combination tank 14. As a result the processing liquid in the processing liquid combination tank 14 begins to move to the processing liquid reservoir 16, and the processing liquid starts to be produced in the processing liquid combination tank 15.

Because the processing liquid combination tanks 14 and 15 are alternatively used, the processing liquid is continuously transferred to the processing liquid reservoir 16. Furthermore, the processing liquid is produced in the processing liquid combination tanks 14 and 15 in the condition that the transfer of the processing liquid to the processing liquid reservoir 16 is suspended Thus, the concentration of the processing liquid can be accurately adjusted.

The processing liquid reservoir 16 temporarily stores the processing liquid transferred from the processing liquid combination tanks 14 and 15, and distributes/transfers the processing liquid to eight substrate processing units 12 via a distribution pipe 19. The processing liquid reservoir 16 has a level gauge 161 to detect the amount of the processing liquid remaining in the processing liquid reservoir 16.

The distribution pipe 19 refers to a pipe system to distribute/transfer the processing liquid from the processing liquid reservoir 16 to eight substrate processing units 12, and forms a circulation channel which starts at the processing liquid reservoir 16 and returns to the processing liquid reservoir 16. A pump 191 and a flow rate gauge 192 are installed in the middle of the distribution pipe 19.

An example of the connection between the distribution pipe 19 and the substrate processing units 12 is now described. Branch pipes 121 extend from the distribution pipe 19, and the processing liquid flows into switching valves 122 via the branch pipes 121. The switching valves 122 switch the pure water supplied from the pure water source 17 with the processing liquid supplied from the branch pipes 121, or vise versa and transfer the selected one to the substrate processing units 12. Flow rate gauges 123 are installed between the switching valves 122 and the substrate processing units 12. Return pipes 124 are installed between the switching valves 122 and the distribution pipe 19. Thus, when the switching valves 122 do not select the processing liquid, the unselected processing liquid, which flows into the switching valves 122 from the branch pipes 121, returns to the distribution pipe 19.

The substrate processing apparatus 1 carries the substrates 7 out of the cassettes 6 connected to the cassette loading unit 4, successively carries the substrate 7 to the substrate processing units 12 to conduct liquid processing of the substrate 7. Then the substrate processing apparatus 1 returns the processed substrates 7 to the cassettes 6, and successively carries new (unprocessed) substrates 7 in the substrate processing units 12. The processing liquid in the processing liquid reservoir 16 is consumed as the liquid processing of the substrate is repeated in the substrate processing units 12. However, the processing liquid is transferred from the processing liquid combination tans 14 and 15 to the processing liquid reservoir 16, thereby supplementing the processing liquid in the processing liquid reservoir 16. Furthermore, if the processing liquid in the processing liquid combination tanks 14 and 15 is exhausted, the processing liquid combination tanks 14 and 15 produce an additional processing liquid.

However, if the processing liquid is not supplied to the processing liquid reservoir 16 due to a certain malfunction of the processing liquid supply unit 13 during operation of the substrate processing apparatus 1, the liquid processing of substrates 7 in the substrate processing units 12 is stopped. If His problem is not properly solved, the incompletely processed substrates 7 are proceed to a next process. When the processing liquid supply unit 13 is malfunctioned, the operation of the substrate processing apparatus 1 will be described below. In the following description that, unless otherwise mentioned, the computer 20 makes "decisions" and "instructions", and controls the substrate processing apparatus 1.

1. When an Amount of the Processing Liquid in the Processing Liquid Reservoir 16 has Decreased When the level gauge 161 detects that the amount of the processing liquid in the processing liquid reservoir 16 is below a predetermined threshold, the computer 20 instructs the sub-transfer unit 5 not to carry new (unprocessed) substrates 7 in the substrate processing apparatus 1. However, the liquid processing of the currently existing substrates 7 in the substrate processing units 12 is continued. If carrying (unprocessed) substrates 7 in the substrate processing apparatus 1 and conducting the liquid processing of the unprocessed substrates 7 are repeated, the processing liquid in the substrate processing apparatus 1 will be completely exhausted. Thus, the liquid processing of substrates will become impossible. However, the existing substrates 7 of the substrate processing units 12 can be processed with the processing liquid remaining in the processing liquid reservoir 16 and the distribution pipe 19. The computer 20 generates an external warning that the amount of the processing liquid remaining in the processing liquid reservoir 16 is below a predetermined threshold. Upon receiving the warning, an operator removes the cause of the malfunction (for example, repairing the processing liquid supply unit 13 or replenishing the processing liquid reservoir 16 with the processing liquid) so that the amount of processing liquid in the processing liquid reservoir 16 reaches the threshold. Then, the computer 20 allows new (unprocessed) substrates 7 to be carried in the substrate processing apparatus 1, and a normal operation of the substrate processing apparatus is resumed.

2. When an Amount of the Processing Liquid in the Processing Liquid Combination Tanks 14 and 15 has Decreased If the amount of the processing liquid in the processing liquid combination tanks 14 and 15 decreases abnormally and fails to return to a normal level, the processing liquid in the processing liquid reservoir 16 becomes insufficient. Particularly, if the level gauges 143 and 153 detect that the amount of the processing liquid in both processing liquid combination tanks 14 and 15 are below a predetermined threshold (either tank 14 or 15 can be empty because the processing liquid combination tanks 14 and 15 alternately produce the processing liquid and transfer it to the processing liquid reservoir 16), the computer 20 instructs the sub-transfer unit 5 not to carry new (unprocessed) substrates 7 in the substrate processing apparatus 1. It is noted that, even in this case, the liquid processing of the existing substrates 7 of the substrate processing units 12 is continued. The computer 20 generates an external warning indicate that the amount of the processing liquid remaining in the processing liquid combination tanks 14 and 15 is below the threshold. Upon receiving the warning, an operator repairs the processing liquid combination tanks 14 and 15, for example, so that the amount of processing liquid in the processing liquid combination tanks 14 and 15 reaches the threshold. Then, the computer 20 allows new (unprocessed) substrates 7 to be carried in the substrate processing apparatus 1, and the normal operation of the substrate processing apparatus 1 is resumed.

3. When a Processing Liquid Delivery Unit Does Not Work Properly

If the processing liquid delivery unit, i.e. the pipes connecting the processing liquid combination tanks 14 and 15 with the processing liquid reservoir 16, as well as the devices installed on the pipes, does not work properly, the processing liquid is not transferred from the processing liquid combination tanks 14 and 15 to the processing liquid reservoir 16. Accordingly, the processing liquid in the processing liquid reservoir 16 will becomes insufficient. Particularly, if the opening/closing valves 144 and 154 or the pumps 145 and 155 do not respond to instructions from the computer 20, it is determined that the processing liquid delivery unit does not work properly. The computer 20 then instructs the sub-transfer unit 5 not to carry new (unprocessed) substrates 7 in the substrate processing apparatus 1. However, even in this case, the liquid processing of the existing substrates 7 of the substrate processing units 12 can be continued. The computer 20 generates an external warning that the processing liquid delivery unit does not work properly. Upon receiving the warning, an operator repairs the opening/closing valves 144 and 154 or the pumps 145 and 155, for example, so that the malfunction of the processing liquid delivery unit is fixed. The computer 20 then allows new (unprocessed) substrates 7 to be carried in the substrate processing apparatus 1, and a normal operation of the substrate processing apparatus 1 is resumed.

4. When a Stock Solution Source Does Not Work Properly

A malfunction of the stock solution source, i.e. the pure water source 17 or the chemical liquid source 18, suspends producing the processing liquid in the processing liquid combination tanks 14 and 15. Accordingly, the processing liquid in the processing liquid reservoir 16 will be exhausted. When the computer 20 is informed with the malfunction of the stock solution source from a higher system, the computer 20 instructs the sub-transfer unit 5 not to carry new (unprocessed) substrates 7 in the substrate processing apparatus 1. However, even in this case, the liquid processing of the existing substrates 7 in the substrate processing units 12 is continued. The computer 20 generates an external warning that the stock solution source does not work properly. Upon receiving the warning, an operator repairs the pure water source 17 or the chemical liquid source 18, for example, so that the malfunction of the chemical liquid source is fixed. The computer 20 then allows new (unprocessed) substrates 7 to be carried in the substrate processing apparatus 1, and the normal operation of the substrate processing apparatus 1 is resumed.

In the above-mentioned Cases 1-4, the computer 20 instruct the substrate processing apparatus 1 not to carry new (unprocessed) substrates 7 in the substrate processing apparatus 1, while letting the etching processing of the existing substrates in the substrate processing units 12 be continued. Thus, when a malfunction of the processing liquid supply unit 13 has been detected, the number of the substrates defected by interrupting the supply of the liquid processing is reduced, compared with a conventional method in which an entire substrate processing apparatus is immediately shut down.

5. When Each Substrate Processing Unit 12 is Supplied with No Processing Liquid

In the above-mentioned Cases 1-4, the liquid processing of the existing substrates 7 in the substrate processing units 12 is continued. However, the processing liquid may not be supplied to the substrate processing units 12 if the processing liquid is not supplemented or if the processing liquid supply unit 13 is not repaired. Furthermore, the processing liquid may not be supplied to the substrate processing units 12 when the distribution pipe 19 or the substrate processing units 12 themselves do not work properly.

Therefore, the computer 20 monitors the flow rate of the processing liquid supplied to the substrate processing units 12 by using a flow rate meter 123. If it is determined that the amount of a supplied processing liquid is below a predetermined threshold, the computer 20 performs the following process on the corresponding substrate processing unit 12. For example, the switching valve 122 switches the processing liquid with the pure water. The pure water is supplied to the substrate processing unit 12 and is used to clean the substrate 7 in the substrate processing unit 12. After the cleaning is completed, the substrate 7 is dried. After the drying is completed, the substrate 7 is taken out of the substrate processing unit 12, and is carried out of the substrate processing apparatus 1 via the main transfer unit 11 and the sub-transfer unit 5. The computer 20 records the event that the liquid processing of the substrate 7 has not been completed in a normal manner. Alternatively, the computer 20 reports the event to a higher system, e.g. a managing system of the entire plant including the substrate processing apparatus 1. The reason that the substrate 7, which has not been completely processed with the processing liquid, is cleaned and dried is to prevent the main-transfer unit 11 and the sub-transfer unit 5 from being contaminated with the processing liquid in taking the substrate 7 wet with the processing liquid out of the substrate processing unit 12.

Because the substrate processing units 12 are individually deactivated when no processing liquid is supplied to the substrate processing units 12, the number of the substrates 7 defected by interrupting the liquid processing can be minimized. Furthermore, because the event that liquid processing of the substrate 7 has incompletely completed is recorded and reported to the higher system, no defective substrate proceeds to a next process.

6. When No Processing Liquid Flows Through a Distribution Pipe 19

If the flow rate meter 192 detects that the flow rate of the processing liquid in the distribution pipe 19 is below a predetermined threshold, the computer 20 shuts down the entire substrate processing apparatus 1, including the pump 191. However, even in this case, all substrate processing units 12, which have not completely conducted the processing liquid, are subjected to the processes described with regard to Case 5. That is, the substrates 7 in the substrate processing units 12 are cleaned and dried, and the substrates 7 are taken out of the substrate processing apparatus 1. Then, the event that the etching processing of the substrates 7 has not been completed is recorded, or is reported to the higher system.

Accordingly, serious damage can be prevented when no processing liquid flows through the distribution pipe 19.

When the processing liquid supply unit 13 does not work properly, one of the above-mentioned measures 1-6 is automatically performed by the computer 20 in the substrate processing apparatus 1. A program to perform the above processes will be described briefly. The program is stored in a storage medium 201 (e.g. a memory, a bard disk a disk-type memory, etc.) installed on the computer 20.

Figure 3:
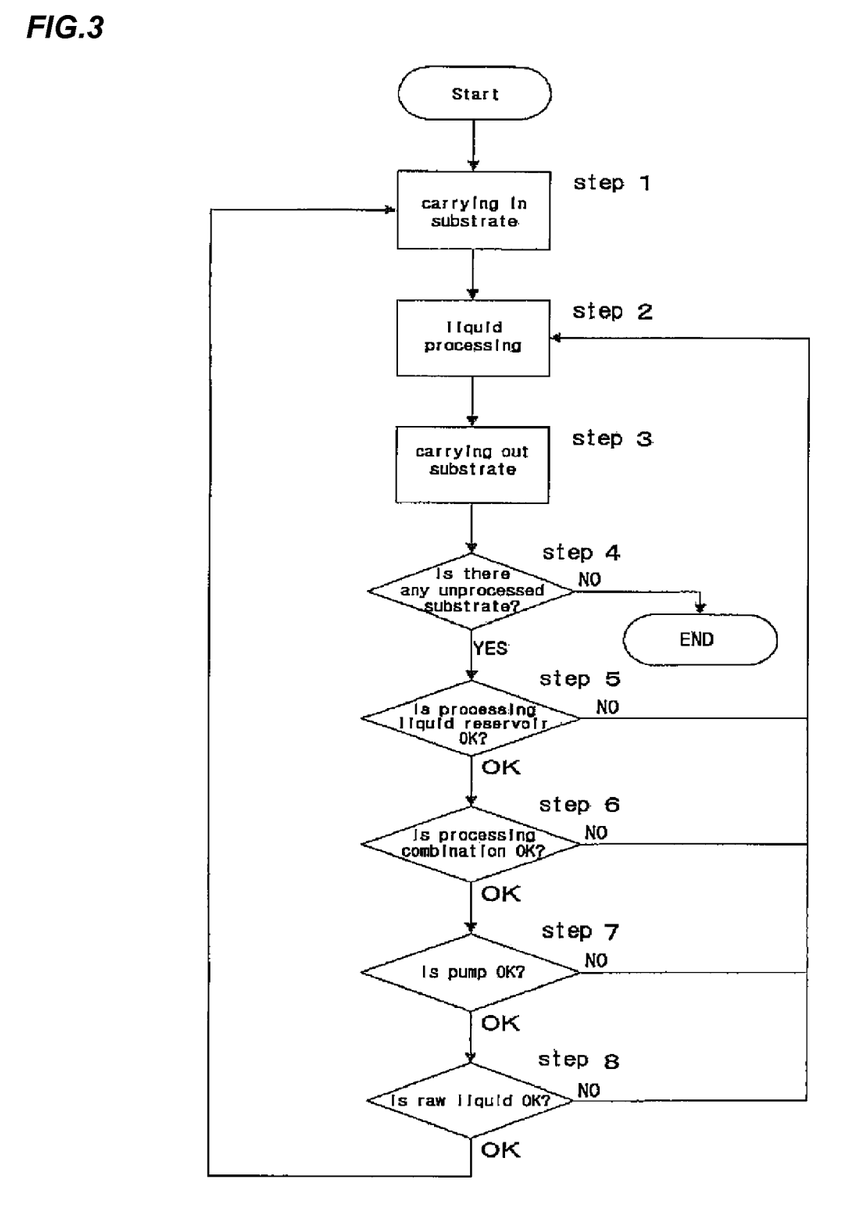
FIG. 3 is a flowchart briefly illustrating a control program of the substrate processing apparatus.

FIG. 3 is a flowchart briefly illustrating a control program of the substrate processing apparatus 1. The control program of the substrate processing apparatus 1 will be described with reference to the step numbers shown in FIG. 3.

Step 1: Carry substrates 7 out of the cassettes 6 and carry them in the liquid processing units 12;

Step 2: Conduct liquid processing of the substrates 7 carried in the liquid processing units 12;

Step 3: Carry the substrate 7 out of the liquid processing units 12 on which the liquid processing has completely conducted;

Step 4: Proceed to step 5 if unprocessed substrates 7 exist in the cassettes 6, or end the process if there is none;

Step 5: Read the level gauge 161 and proceed to step 6 if the amount of the processing liquid remaining in the processing liquid reservoir 16 is above a predetermined threshold, or output an alarm and return to step 2 if the amount is below the threshold;

Step 6: Read the level gauges 143 and 153 and proceed to step 7 if the amount of processing liquid remaining in at least one of the processing liquid combination teaks 14 and 15 is above a predetermined threshold, or output an alarm and return to step 2 if the amount in both tanks is below the threshold;

Step 7: Return to step 8 if the pumps 145 and 155 work properly, or output an alarm and return to step 2 if the pumps do not work properly; and Step 8: Return to step 1 if the pure water source 17 and the chemical liquid source 18 work properly, or output an alarm and return to step 2 if either the pure water source 17 or the chemical liquid source 18 does not work properly.

Thus, when the amount of the processing liquid remaining in the processing liquid reservoir 16 and in the processing liquid combination tanks 14 and 15 is within a normal range, and when the pumps 145 and 155, the pure water source 17, and the chemical liquid source 18 work properly, carrying new substrates 7 in and out of the liquid processing units 12 is repeatedly conducted until the liquid processing of all existing substrates 7 in the cassettes 6 is completed. If the amount of the processing liquid remaining in the reservoir 16 and in the tanks 14 and 15 is not within a normal range or if any of the pumps 145, 155, the pure water source 17, and the chemical liquid source 18 does not work properly, carrying new substrates 7 in the liquid processing units 12 is suspended, and the liquid processing of the substrates, which has being processed, is continued.

Figure 4:
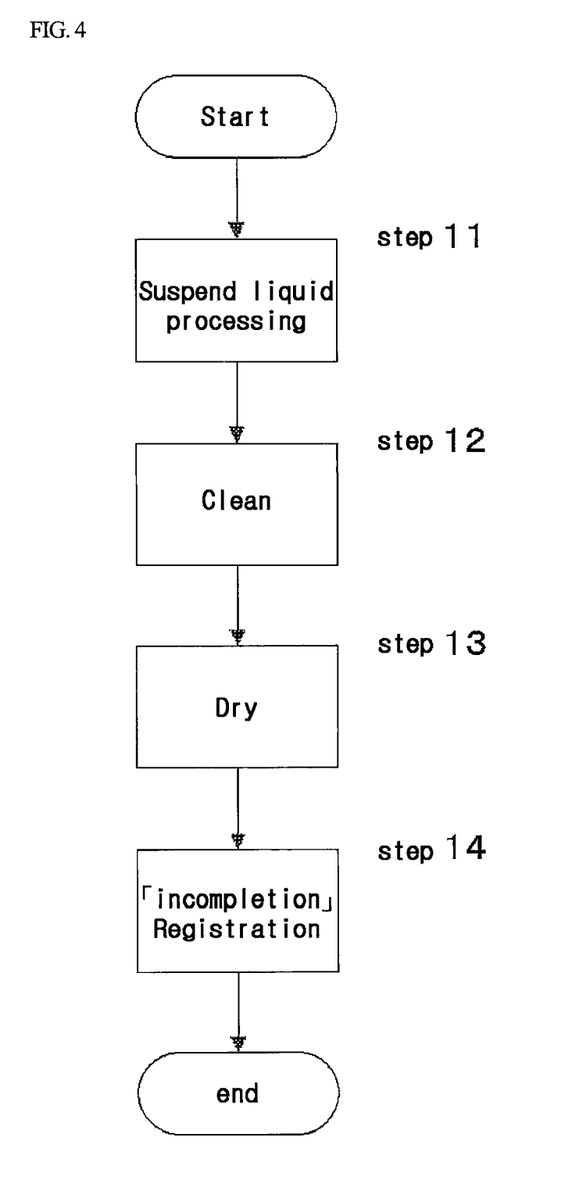
FIG. 4 is a flowchart briefly illustrating an emergency stop program for emergency stop of each liquid processing unit.

FIG. 4 is a flowchart briefly illustrating an emergency stop program for emergency stop of each liquid processing unit 12. The emergency stop program is performed if the flow rate meter 123 detects that the flow rate of the processing liquid flowing into the liquid processing units 12 is below a predetermined threshold. The emergency stop program will be described with reference to step numbers shown in FIG. 4.

Step 11: Suspend the liquid processing of the liquid processing units 12;

Step 12: Switch the switching valves 122 so that pure water is introduced into the liquid processing units 12 to clean the substrates 7 in the liquid processing units 12;

Step 13: Dry the substrates 7 after the cleaning is completed; and

Step 14: Record on the computer 20 the event that the liquid processing of the substrates is incomplete and report the event to a higher system.

Figure 5:
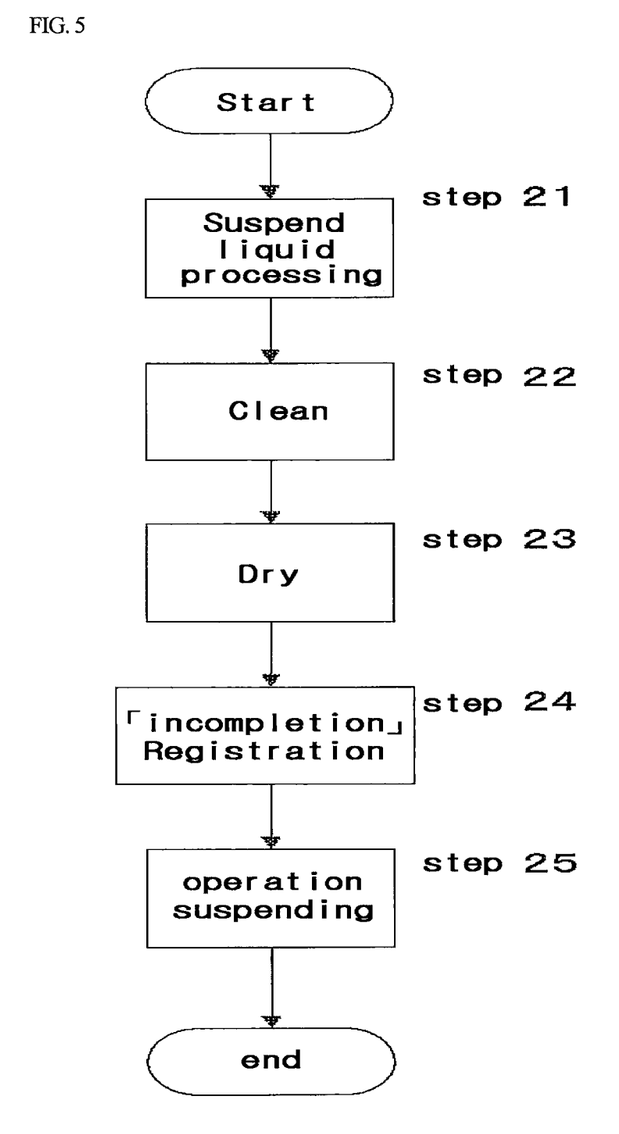
FIG. 5 is a flowchart briefly illustrating a shutdown program of the substrate processing apparatus.

FIG. 5 is a flowchart briefly illustrating a shutdown program to shut down the substrate processing apparatus 1. The shutdown program is performed when the flow rate meter 192 detects that the flow rate of the processing liquid returning to the processing liquid reservoir 16 is below a predetermined threshold. The shutdown program will be described with reference to step numbers shown in FIG. 5.

Step 21: Suspend the liquid processing in all operating liquid processing units 12;

Step 22: Switch the switching valves 122 so that pure water is introduced into the liquid processing units 12 to clean the substrates 7 in the liquid processing units 12;

Step 23: Dry the substrates 7 after the cleaning is completed;

Step 24: Record on the computer 20 the event that the liquid processing of the substrates 7 is incomplete and report the event to a higher system; and Step 25: Shut down the substrate processing apparatus 1.

Although an exemplary embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A substrate processing method using a substrate processing apparatus that includes a processing liquid supplying unit that stores and supplies a processing liquid, a level gauge that detects a level of the processing liquid at the processing liquid supplying unit, a plurality of liquid processing units, a flow rate meter installed at a distribution pipe provided between the processing liquid supplying unit and the plurality of liquid processing units, a plurality of branch pipes provided for each of the plurality of liquid processing units, and a plurality of flow rate gauges installed at each of the plurality of branch pipes, the substrate processing method comprising:

sequentially carrying a plurality of substrates into the plurality of liquid processing units;

supplying a processing liquid from the processing liquid supply unit to the plurality of liquid processing units to conduct a liquid processing for each of the plurality of substrates;

carrying one of the plurality of substrates out of the plurality of liquid processing units after the liquid processing is completed for the one of the plurality of substrates while the rest of the plurality of substrates remain in the liquid processing units;

detecting an amount of the processing liquid remaining in the processing liquid supply unit using the level gauge while each of the liquid processing units is conducting a liquid processing for each of the plurality of substrates;

carrying an unprocessed substrate into one of the plurality of liquid processing units where the one of the plurality of substrates completed with the liquid processing is carried out;

when it is detected by the level gauge that the amount of the processing liquid remaining in the processing liquid supply units is below a predetermined threshold, suspending the carrying of the unprocessed substrate into one of the plurality of liquid processing units where the one of the plurality of substrates completed with the liquid processing is carried out while continuing the liquid processing for the plurality of substrates remaining in the processing units, thereby completing the liquid processing for the plurality of substrates remaining in the processing units;

detecting a flow rate of the processing liquid supplied to each of the liquid processing units from the distribution pipe using a corresponding flow rate gauge installed at each of the plurality of branch pipes;

when it is detected by the corresponding flow rate gauge that the supplying of the processing liquid to a corresponding liquid processing unit is suspended, suspending an operation of the corresponding liquid processing unit and recording an event that the liquid processing of the substrate in the corresponding liquid processing unit is incomplete;

returning the processing liquid that is not used by the corresponding liquid processing unit to the processing liquid supply unit in a lump;

detecting a flow rate of the processing liquid returning to the processing liquid supply unit using the flow rate meter; and when it is detected by the flow rate meter that the flow rate of the processing liquid returning to the processing liquid supply unit is below a predetermined threshold, suspending the liquid processing of the substrates in all of the operating processing units and recording an event that the liquid processing of the substrates in all of the operating liquid processing units is incomplete.

2. The substrate processing method of claim 1, wherein the processing liquid supply units comprise a processing liquid combination tank, a processing liquid reservoir, a processing liquid transfer unit, and a processing liquid distributor, and the substrate processing method further comprises:

combining in the processing liquid combination tank stock solutions supplied from a plurality of stock solution sources to produce the processing liquid;

transferring the processing liquid produced in the processing liquid combination tank to the processing liquid reservoir by the processing liquid transfer unit and containing the processing liquid in the processing liquid reservoir; and distributing the processing liquid contained in the processing liquid reservoir to the liquid processing units by the processing liquid distributor.

3. The substrate processing method of claim 2, further comprising suspending carrying the unprocessed substrate into one of the plurality of liquid processing units when the amount of the processing liquid in the processing liquid reservoir is below a predetermined threshold.

4. The substrate processing method of claim 2, further comprising suspending carrying the unprocessed substrate into one of the plurality of liquid processing units when the amount of the processing liquid in the processing liquid combination tank is below a predetermined threshold.

5. The substrate processing method of claim 2, further comprising suspending carrying the unprocessed substrate into one of the plurality of liquid processing units when a malfunction of the processing liquid delivery unit is detected.

6. The substrate processing method of claim 2, further comprising suspending carrying the unprocessed substrate into one of the plurality of liquid processing units when a malfunction of the stock solution sources is detected.

7. The substrate processing method of claim 1, further comprising making the liquid processing units to clean the substrates with pure water and to dry the substrates when it is determined that the supplying the processing liquid to the liquid processing units is suspended.

8. The substrate processing method of claim 1, further comprising making all operating liquid processing units to clean the substrates with pure water and to dry the substrates when the flow rate of the processing liquid returning to the processing liquid supply unit is below the predetermined threshold.

9. A non-transitory computer-readable recording medium storing a computer executable program that, when executed, causes a computer to perform a substrate processing method using a substrate processing apparatus that includes a processing liquid supplying unit that stores and supplies a processing liquid, a level gauge that detects a level of the processing liquid at the processing liquid supplying unit, a plurality of liquid processing units, a flow rate meter installed at a distribution pipe provided between the processing liquid supplying unit and the plurality of liquid processing units, a plurality of branch pipes provided for each of the plurality of liquid processing units, and a plurality of flow rate gauges installed at each of the plurality of branch pipes, the substrate processing method comprising:

sequentially carrying a plurality of substrates into the plurality of liquid processing units;

supplying a processing liquid from the processing liquid supply unit to the plurality of liquid processing units to conduct a liquid processing for each of the plurality of substrates;

carrying one of the plurality of substrates out of the plurality of liquid processing units after the liquid processing is completed for the one of the plurality of substrates while the rest of the plurality of substrates remain in the liquid processing units;

detecting an amount of the processing liquid remaining in the processing liquid supply unit using the level gauge while each of the liquid processing units is conducting a liquid processing for each of the plurality of substrates;

carrying an unprocessed substrate into one of the plurality of liquid processing units where the one of the plurality of substrates completed with the liquid processing is carried out;

when it is detected by the level gauge that the amount of the processing liquid remaining in the processing liquid supply units is below a predetermined threshold, suspending the carrying of the unprocessed substrate into one of the plurality of liquid processing units where the one of the plurality of substrates completed with the liquid processing is carried out while continuing the liquid processing for the plurality of substrates remaining in the processing units, thereby completing the liquid processing for the plurality of substrates remaining in the processing units;

detecting a flow rate of the processing liquid supplied to each of the liquid processing units from the distribution pipe using a corresponding flow rate gauge installed at each of the plurality of branch pipes;

when it is detected by the corresponding flow rate gauge that the supplying of the processing liquid to a corresponding liquid processing unit is suspended, suspending an operation of the corresponding liquid processing unit and recording an event that the liquid processing of the substrate in the corresponding liquid processing unit is incomplete;

returning the processing liquid that is not used by the corresponding liquid processing unit to the processing liquid supply unit in a lump;

detecting a flow rate of the processing liquid returning to the processing liquid supply unit using the flow rate meter; and when it is detected by the flow rate meter that the flow rate of the processing liquid returning to the processing liquid supply unit is below a predetermined threshold, suspending the liquid processing of the substrates in all of the operating processing units and recording an event that the liquid processing of the substrates in all of the operating liquid processing units is incomplete.

* * * * *